United States Patent
Yang et al.

(10) Patent No.: US 7,911,044 B2
(45) Date of Patent: Mar. 22, 2011

(54) RF MODULE PACKAGE FOR RELEASING STRESS

(75) Inventors: Wen-Kun Yang, Hsin-Chu (TW); Chun-Hui Yu, Tainan (TW); Chihwei Lin, Gueiren Township, Tainan County (TW)

(73) Assignee: Advanced Chip Engineering Technology Inc., Hukou Township, Hsinchu County (TW)

( * ) Notice: Subject to any disclaimer, the term of this patent is extended or adjusted under 35 U.S.C. 154(b) by 45 days.

(21) Appl. No.: 11/647,448

(22) Filed: Dec. 29, 2006

(65) Prior Publication Data
US 2008/0157341 A1 Jul. 3, 2008

(51) Int. Cl.
*H01L 23/02* (2006.01)
(52) U.S. Cl. ........ 257/685; 257/706; 257/723; 257/782; 257/E33.075; 257/E23.051
(58) Field of Classification Search ............... 257/685, 257/686, 777, 723, 774, 706, 707, 712, 713, 257/796, 675, 676, 677, 698, 782, E25.031, 257/E25.032, E23.042, E33.075, E23.051, 257/E23.08
See application file for complete search history.

(56) References Cited

U.S. PATENT DOCUMENTS

| 7,061,113 | B2* | 6/2006 | Fujiwara et al. | 257/758 |
| 2002/0070443 | A1* | 6/2002 | Mu et al. | 257/712 |
| 2005/0062147 | A1* | 3/2005 | Wakisaka et al. | 257/712 |
| 2005/0121770 | A1* | 6/2005 | Baek et al. | 257/698 |
| 2005/0212107 | A1* | 9/2005 | Kato | 257/678 |
| 2006/0087037 | A1* | 4/2006 | Hsu | 257/738 |
| 2007/0138603 | A1* | 6/2007 | Lam | 257/666 |
| 2007/0166551 | A1* | 7/2007 | Lin | 428/423.1 |
| 2007/0187836 | A1* | 8/2007 | Lyne | 257/777 |
| 2008/0116564 | A1* | 5/2008 | Yang et al. | 257/698 |
| 2008/0157340 | A1* | 7/2008 | Yang et al. | 257/691 |

* cited by examiner

*Primary Examiner* — A. Sefer
*Assistant Examiner* — Dilinh P Nguyen (57) ABSTRACT

The present invention discloses a structure of package comprising: a substrate with a die receiving through hole; a base attached on a lower surface of the substrate; a die disposed within the die receiving through hole and attached on the base; a dielectric layer formed on the die and the substrate; a re-distribution layer (RDL) formed on the dielectric layer and coupled to the die; a protection layer formed over the RDL; and pluralities of pads formed on the protection layer and coupled to the RDL. The RDL is made from an alloy comprising Ti/Cu/Au alloy or Ti/Cu/Ni/Au alloy.

8 Claims, 6 Drawing Sheets

RF MODULE PACKAGE FOR RELEASING STRESS

FIELD OF THE INVENTION

This invention relates to a structure of package, and more particularly to a RF (radio frequency) module package with die receiving through-hole of substrate to improve the reliability and to reduce the device size.

DESCRIPTION OF THE PRIOR ART

In the field of semiconductor devices, the device density is increased and the device dimension is reduced, continuously. The demand for the packaging or interconnecting techniques in such high density devices is also increased to fit the situation mentioned above. Conventionally, in the flip-chip attachment method, an array of solder bumps is formed on the surface of the die. The formation of the solder bumps may be carried out by using a solder composite material through a solder mask for producing a desired pattern of solder bumps. The function of chip package includes power distribution, signal distribution, heat dissipation, protection and support . . . and so on. As a semiconductor become more complicated, the traditional package technique, for example lead frame package, flex package, rigid package technique, can't meet the demand of producing smaller chip with high density elements on the chip.

Furthermore, because conventional package technologies have to divide a dice on a wafer into respective dies and then package the die respectively, therefore, these techniques are time consuming for manufacturing process. Since the chip package technique is highly influenced by the development of integrated circuits, therefore, as the size of electronics has become demanding, so does the package technique. For the reasons mentioned above, the trend of package technique is toward ball grid array (BGA), flip chip (FC-BGA), chip scale package (CSP), Wafer level package (WLP) today. "Wafer level package" is to be understood as meaning that the entire packaging and all the interconnections on the wafer as well as other processing steps are carried out before the singulation (dicing) into chips (dies). Generally, after completion of all assembling processes or packaging processes, individual semiconductor packages are separated from a wafer having a plurality of semiconductor dies. The wafer level package has extremely small dimensions combined with extremely good electrical properties.

The MCM may also contain passive components, e.g. capacitors, inductors, and resistors. A typical arrangement for RF package is an RF circuit chip and a capacitor mounted on the substrate. The substrate can be laminate, ceramic, silicon, or other appropriate material. It is because the rapid development of communication technology, the RF package is more important than ever. The requirements for the RF module includes high circuit density, low electrical loss, excellent dimensional control, high heat dissipation, robust substrate, higher reliability on board and lower cost. However, the prior RF module package employs LTCC (low-temperature co-fired ceramic) and the disadvantage is listed as follows; Low On Board Reliability (TCT—temperature cycling test); Need extra metal plate for heat dissipation, Long manufacturing cycle; Higher manufacturing cost; IC need to be packaged in advance; Still need wire bonding or SMT (surface mount technology) process; Thick package body (~1.4 mm).

Therefore, the present invention provides a RF module package to fit the requirement above.

SUMMARY OF THE INVENTION

The object of the present invention is to provide RF module package with excellent thermal dissipation, CTE performance and shrinkage size.

An RF module package comprising: a substrate with a die receiving through holes and contact conductive pads and metal through holes; a conductive slice (foil) attached on a lower surface of said substrate; multiple dice disposed within said die receiving through hole and on said conductive slice; multiple dielectric stacking structure stacked on said multiple dice and said substrate; multiple re-distribution layers (RDL) formed (includes the inductors and resistors) within said multiple dielectric stacking structure and coupled to said dice; a top conductive layer formed over said multiple dielectric stacking structure. And heat sink materials (includes the Molecular cooling fans) are formed on said top conductive layer. Conductive bumps maybe coupled to said pluralities of terminal pads.

DESCRIPTION OF THE PREFERRED EMBODIMENT

The invention will now be described in greater detail with preferred embodiments of the invention and illustrations attached. Nevertheless, it should be recognized that the preferred embodiments of the invention is only for illustrating. Besides the preferred embodiment mentioned here, present invention can be practiced in a wide range of other embodiments besides those explicitly described, and the scope of the present invention is expressly not limited expect as specified in the accompanying Claims.

The present invention discloses a structure of RF module package utilizing a substrate having predetermined terminal contact metal pads 3 and metal through holes 15 formed thereon and a pre-formed die receiving through holes 4 formed into the substrate 2. A multi-dice 6 are (chip a, chip b and chip n) disposed within the die receiving through hole of the substrate, an elastic core paste material is filled into the space between dice, die edge and side wall of die receiving through hole of the substrate. A photosensitive material is coated over the die and the pre-formed substrate (includes the core paste area). Preferably, the material of the photosensitive material is formed of elastic material.

Figure 1:
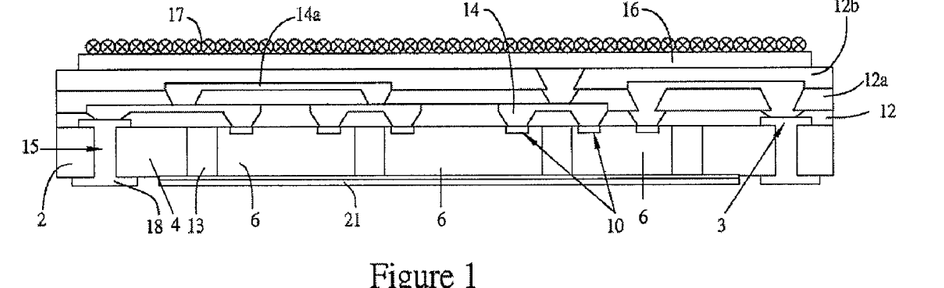
FIG. 1 illustrates a cross-sectional view of a structure of RF module package according to the present invention. (LGA type)

FIG. 1 illustrates a cross-sectional view of RF module package in accordance with one embodiment of the present invention. As shown in the FIG. 1, the structure includes a substrate 2 having a terminal contact metal pads 3 and metal through holes 15 (for organic substrate) and die receiving through holes 4 formed therein to receive multiple dice 6. The multiple dice 6 are including the silicon chips and gallium arsenic chips (GaAs) The through holes 4 are formed from the upper surface of the substrate through the substrate to the lower surface. The through hole 4 is pre-formed within the substrate 2. A conductive slice (foil) 21 is attached on the lower surface of the substrate 2, preferably, the conductive slice 21 is formed by plating Cu or laminated Cu.

The dice 6 are disposed within the die receiving through holes 4 on the substrate 2. As know; contact pads (Bonding pads) 10 are formed on the dice 6. A first photosensitive layer or dielectric layer 12 is formed over the multiple dice 6 and the upper surface of substrate and core paste 13 is filled within the space between the dice 6, die edge and the sidewalls of the through holes 4. Pluralities of openings are formed within the dielectric layer 12 through the lithography process or exposure and develop procedure. The pluralities of openings are aligned to the contact pads or I/O pads 10 and terminal contact metal pads 3 on the substrate, respectively. The first RDL (redistribution layer) 14, also referred to as conductive trace 14, is formed on the first dielectric layer 12 by removing selected portions of metal layer formed over the layer 12, wherein the first RDL 14 keep electrically connection with the dice 6 through the I/O pads 10 and terminal contact metal pads 3. A part of the material of the first RDL will re-fills into the openings in the first dielectric layer 12. The pads 3 is coupled to the pads 18 (lower side of substrate) through the metal through hole 15 in the substrate 2.

By the same way, a second dielectric layer 12a with second RDL 14a and a third dielectric layer 12b with top metal layer 16 are subsequently formed over the first dielectric layer 12, thereby constructing a stacked interconnection structure with multi-layers RDL. As it can be seen, the second RDL 14a couples the dice through first RDL 14, and the top metal layer 16 may couple to either first RDL 14 or second RDL 14a.

The layer 16 is a conductive (metal or alloy) layer 16 that covers the third dielectric layer 12b. A heat sink 17 is formed atop the metal layer 16 for better thermal dissipation. Preferably, the heat sink 17 is mode of molecular cooling fan. The molecular groups vibrate with more energy at higher surface temperature. The vibration can relax after emitting a phone, infrared radiation, allowing the substrate to release energy even when the surroundings are also warm. Terminal pads 18 are located under the substrate 2 and connected to the first RDL 14, 14a, 16 and contact metal pads 3 of the substrate.

The dielectric layer 12 is formed atop of the multiple dice 6 and substrate 2 and refilling material such as elastic core paste. They act as buffer to absorb the thermal mechanical stress between the dice 6 and substrate 2 during temperature cycling due to the dielectric layer 12 is elastic property. The aforementioned structure constructs LGA type package. The pads 3 may be formed within the dielectric layer 12, over the substrate 2 and maybe aligned to the terminal pad 18. An alternative embodiment can be seen in FIG. 2, conductive balls 20 are formed on the terminal pads 18. This type is called BGA type. The other parts are similar to FIG. 1, therefore, the detailed description is omitted. The terminal pads 18 act as the UBM (under ball metal) under the BGA scheme in the case.

Preferably, the material of the substrate 2 is organic substrate likes epoxy type FR5, BT, PCB with defined through holes or Cu metal with pre etching circuit. Preferably, the CTE is the same as the one of the mother board (PCB). Preferably, the organic substrate with high Glass transition temperature (Tg) are epoxy type FR5 or BT (Bismaleimide triazine) type substrate. The Cu metal (CTE around 16) can be used also. The glass, ceramic, silicon can be used as the substrate. The elastic core paste is formed of silicone rubber elastic materials, it maybe the same with the die attached materials.

It is because that the CTE (X/Y direction) of the epoxy type organic substrate (FR5/BT) is around 16 and the CTE of the tool for chip redistribution is around 5 to 8 by employing the glass materials as the tool. The FR5/BT is unlikely to return to original location after the temperature cycling (the temperature is close to Glass transition temperature Tg) that causes the die shift in panel form during the WLP process which needs several high temperature process. For example, the dielectric layers formation, the heat curing die attached materials etc., once the base is attached on the die back side and substrate with die redistribution tool together; the base is used to make sure organic substrate can keep the die at the original location and no any warp occurs during process.

Figure 3:
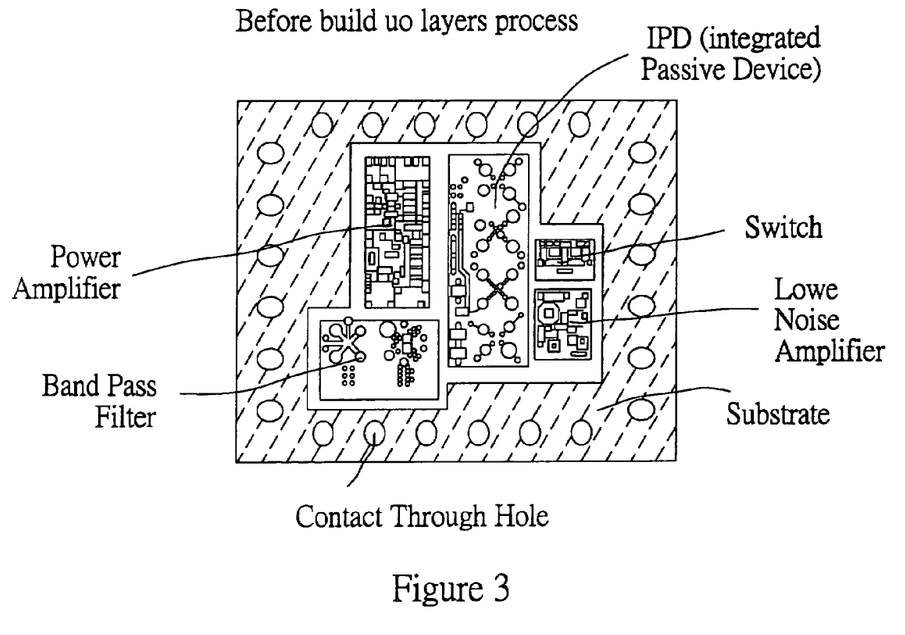
FIG. 3 illustrates a top view of a structure of RF module package according to the present invention.
Figure 4:
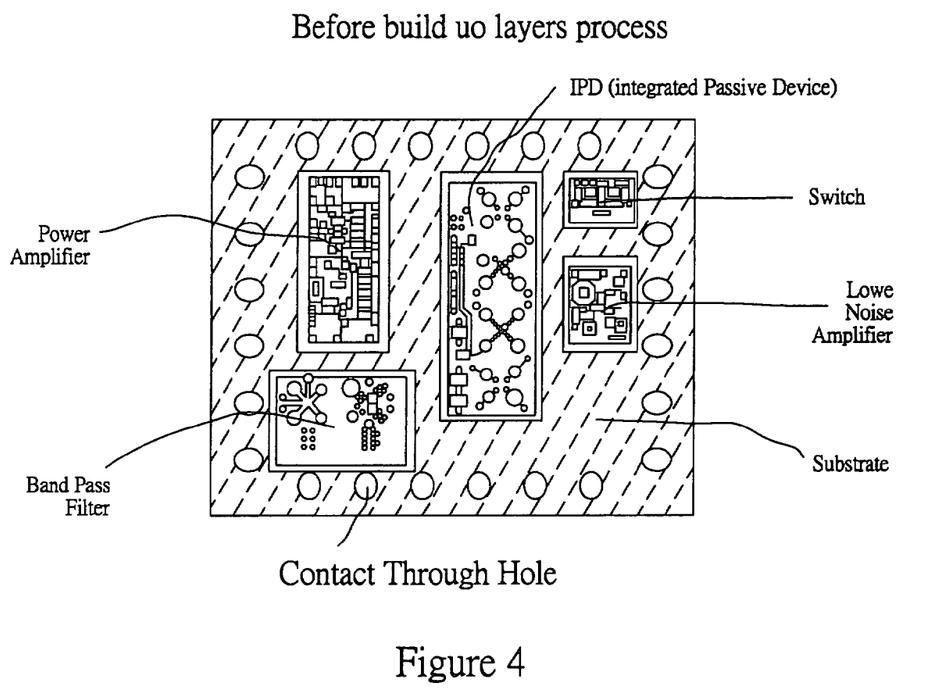
FIG. 4 illustrates a top view of the RF module package according to the present invention.
Figure 5:
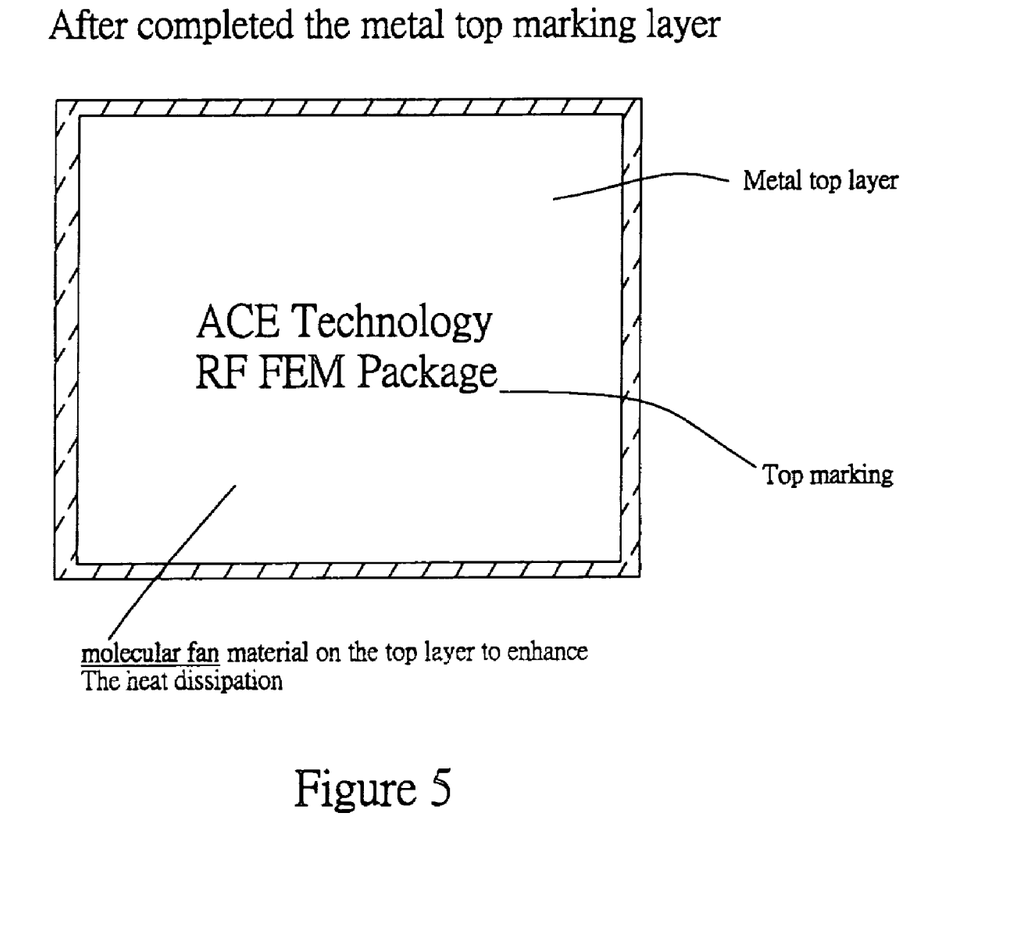
FIG. 5 illustrates a top view of the RF module package according to the present invention.
Figure 6:
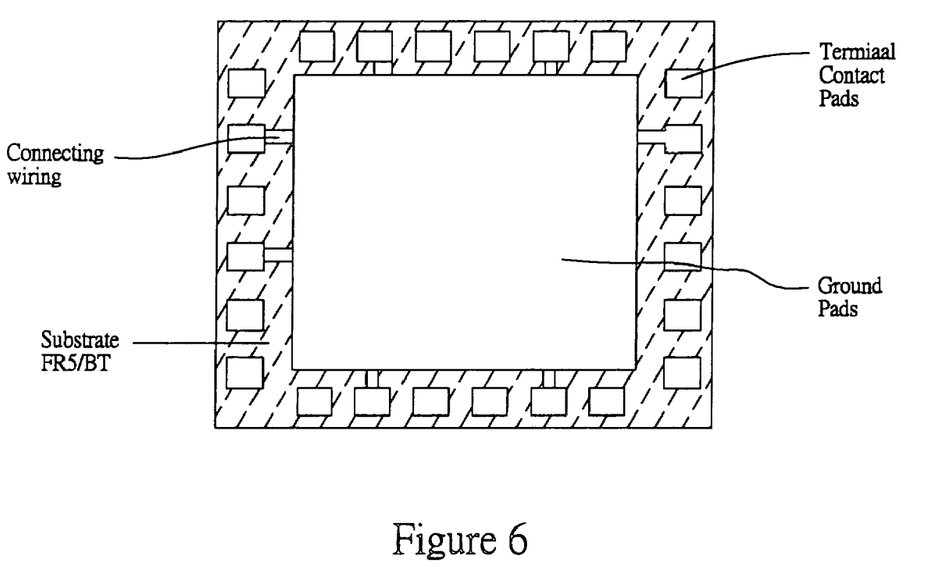
FIG. 6 illustrates a bottom view of the RF module package according to the present invention.

The substrate could be round type such as wafer type, the diameter could be 200, 300 mm or higher. It could be employed for rectangular type such as panel form. The substrate 2 is pre-formed with die receiving through holes 4. FIG. 3 is the top view of RF module package. The package includes power amplifier, band pass filter, switch, low noise amplifier, integrated passive device (IPD) formed on the substrate. FIG. 4 illustrates further embodiment of the present invention. A text, character, logo may be marked on the top metal layer 16 as shown in FIG. 5. The top layer can be a ground shielding, heat sink. FIG. 6 is the bottom view of the present invention.

In one embodiment of the present invention, the dielectric layer 12, 12a, 12b are preferably an elastic dielectric material which is made by silicone dielectric based materials comprising siloxane polymers (SINR), Dow Corning WL5000 series, and the combination thereof. In another embodiment, the dielectric layer is made by a material comprising, polyimides (PI) or silicone resin. Preferably, it is a photosensitive layer for simple process. In one embodiment of the present invention, the elastic dielectric layer is a kind of material with CTE larger than 100 (ppm/° C.), elongation rate about 40 percent (preferably 30 percent-50 percent), and the hardness of the material is between plastic and rubber. The thickness of the elastic dielectric layer 18 depends on the stress accumulated in the RDL/dielectric layer interface during temperature cycling test.

Figure 7:
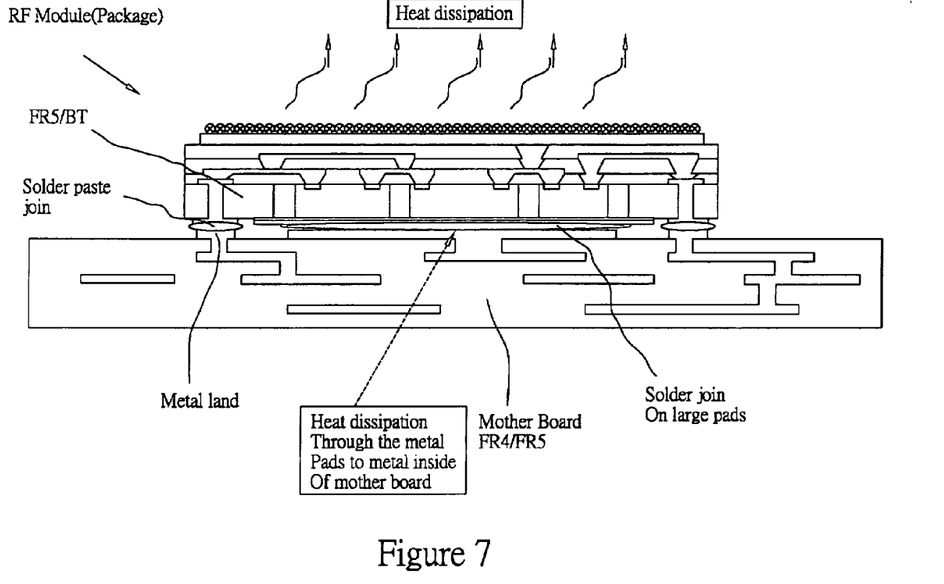
FIG. 7 illustrates a cross-sectional view of a structure of RF module package on board according to the present invention.

Please refer to FIG. 7, it illustrates the major portions that associate with the CTE issue. The silicon dice (CTE is ~2.3) is packaged inside the package. FR5 or BT organic epoxy type material (CTE~16) is employed as the substrate and its CTE is the same as the PCB or Mother Board. The space (gap) between the dice and the substrate is filled with filling material (prefer the elastic core paste) to absorb the thermal mechanical stress due to CTE mismatching (between die and the epoxy type FR5/BT). Further, the dielectric layers 12 include elastic materials to absorb the stress between the die pads and the PCB. The RDL metal is Cu/Au materials and the CTE is around 16 that is the same as the PCB and organic substrate, and the UBM 18 of contact bump be located on the terminal contact metal pads 3 of substrate. The metal land of PCB is Cu composition metal, the CTE of Cu is around 16 that is match to the one of PCB. From the description above, the present invention may provide excellent CTE (fully matching in X/Y direction) solution for the WLP.

Apparently, CTE matching issue under the build up layers (PCB and substrate) is solved by the present scheme and it provides better reliability (no thermal stress in X/Y directions for terminal pads (solder balls/bumps) on the substrate during on board level condition) and the elastic DL is employed to absorb the Z direction stress. The space (gap) between chip edge and sidewall of through holes of substrate can be used to fill the elastic dielectric materials to absorb the mechanical/thermal stress.

In one embodiment of the invention, the material of the RDLs 14, and 14*a* comprise Ti/Cu/Au alloy or Ti/Cu/Ni/Au alloy; the thickness of the RDL 14 is between 2 um_and_15 um. The Ti/Cu alloy is formed by sputtering technique also as seed metal layers, and the Cu/Au or Cu/Ni/Au alloy is formed by electroplating; exploiting the electro-plating process to form the RDL can make the RDL thick enough and better mechanical properties to withstand CTE mismatching during temperature cycling. If the structure of FO-WLP utilizes SINR as the elastic dielectric layer and Cu as the RDL, according the stress analysis not shown here, the stress accumulated in the RDL/dielectric layer interface is reduced.

In one embodiment of the invention, the structure and function of RDLs 14 are used as the build in inductors and resistors, preferably, the inductors are located on the top of capacitors of IPD (integrated passive device), it can generates the best electrical performance to reduce the electrical loss; it is due to the low dielectric constant and control of thickness, space, line width of RDLs 14; preferably the metal thickness between 4 um to 10 um, metal space around 10 um and metal width around 12 um to get better electrical performance.

In another embodiment of the invention, the function of combine the conductive slice 21 (lower side of substrate) and top conductive layer 16 are used for better thermal management and ground shielding; preferably, to use the sputtering the seed metal on the back-side of chips and electro-plating the Cu/Ni/Au to reach the thickness around 15 um to 25 um (the back side of chips are ground (GND) due to the chips (GaAs) with ground via holes on the back side), the conductive slice 21 may be solder join with ground pads of PCB to get the better heat dissipation and grounding. The top conductive layer 16 is connecting to ground signal (GND); preferably, the material of conductive layer is Cu for better heat conductivity and ground shielding, it may be coated the heat sink materials to enhance the thermal management (preferably the molecular cooling fan to handle the heat dissipation).

Figure 2:
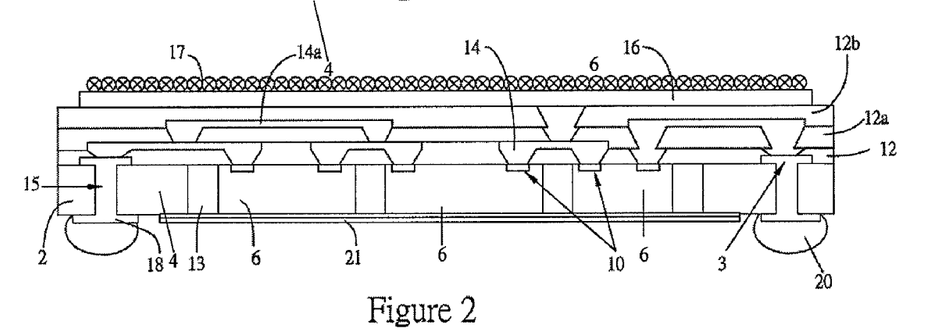
FIG. 2 illustrates a cross-sectional view of a structure of RF module package according to the present invention. (BGA type)

As shown in FIG. 1-2, the RDLs 14 fans out of the die and communicates toward the terminal pads. It is different from the prior art technology, the dice 6 is received within the pre-formed die receiving through hole of the substrate, thereby reducing the thickness of the package. The prior art violates the rule to reduce the die package thickness. The package of the present invention will be thinner than the prior art. Further, the substrate is pre-prepared before package. The through hole 4 is pre-determined. Thus, the throughput will be improved than ever. The present invention discloses a fan-out WLP with reduced thickness and good CTE matching performance.

The present invention includes preparing a dicing sawed wafer in blue tape form (GaAs) and preparing the die redistribution tool (Glass base) with patterned glues and alignment pattern on the tool, followed by employing a pick and place with fine alignment system to pick and place the selected chips on the tool and patterned glues stick the die active surface. The substrate is bonding on the tool and patterned glues stick the substrate. A Vacuum printing is performed to print the core paste material (silicone rubber) into the gap between the die edge and the side wall of die through holes of substrate. The core paste is cured and special solvent is used to release the panel wafer and tool. Thereafter, the panel wafer is cleaned.

The seed metal is sputtered on the back side of the panel. PR is coating and forming the desired pattern. Electro-plating is performed to form the Cu/Ni/Au (~25 um). The PR is stripped and wet etching is used to form the ground metal Pads and terminal pads. The Glass Carrier is bounded on the back side of panel and UV curing is used to attached the Glass carrier and the Panel.

The steps to form the RDL includes:
Cleaning the upper side of panel by wet/dry clean;
Coating the dielectric layer 1 and open the bonding pads and metal contact pads on substrate (panel);
Sputtering the Ti/Cu as seed metal layers;
PR coating and to form the RDL pattern;
Electro-plating Cu/Au (4 um~10 um), and then stripping the PR and wet etching to form the first RDL trace metal;
Coating the dielectric layer 2 and open the contact Vias;
Sputtering the Ti/Cu as seed metal layer;
PR coating and forming the RDL pattern (including the inductors);
Electro-plating Cu/Au (4 um~10 um), then removing PR and wet etching to form the second RDL trace metal;
Coating the dielectric layer 3 (thick than 50 um) and opening the ground contact Vias;
Sputtering the seed metal layers (Ti/Cu);
PR coating and forming the top ground metal pattern;
Electro-plating Cu/Au (~15 um), PR strip and wet etching to form the ground pads on top (including the character of top mark);
Coating the heat sink materials—molecular cooling fan on the top metal (<10 um) to enhance the heat dissipation.

Then, the Glass carrier is removed by special solvent and/or UV light; the panel is typing on the blue tape in flame type. The panel final testing is performed by using the flame type probing system. The panel (substrate-FR5/BT) is cut to separate the package unit.

The advantages of the present inventions are:
Low Cost: materials and process;
Better performance on board Reliability (TCT);
The CTE of Substrate FR5 matches to the one of PCB FR4 (~16);
Better Thermal Management—employing metal to handle heat dissipation; Copper thermal conductive k=380, LTCC k=3-5
Using GaAs for IPD due to Low Electrical Loss, high Q;
Dielectric materials: low k (<3), Dielectric constant for Ceramic k=3-5;
Short manufacturing cycle time due to apply simple process.

Elastic core paste (resin, epoxy compound, silicone rubber, etc.) is refilled the space between the dice edge and the sidewall of the through holes for thermal stress releasing buffer in the present invention, then, vacuum heat curing is applied. CTE mismatching issue is overcome during panel form process (using the glass carrier with lower CTE that close to silicon die) and the deepness between die and substrate FR5/BT is same level, the surface level of die (active surface side) and substrate can be the same after the die and substrate are attached on the glass carrier, and separated the panel wafer from the die redistribution tool. For example, as shown in FIGS. 1 and 2, the top surface of the core paste 13, the die 6 and the substrate 2 are at the same plane. Only silicone dielectric material (preferably SINR) is coated on the active surface and the substrate (preferably FR45 or BT) surface. The contact pads are opened by using photo mask process only due to the dielectric layer (SINR) is photosensitive layer for opening the contacting open. The conductive slice (foil) material is plated on the back-side of dice and substrate be solder join together with PCB. The reliability for both package and board level is better than ever, especially, for the board level temperature cycling test, it was due to the CTE of substrate and PCB mother board are identical, hence, no thermal mechanical stress be applied on the solder bumps/balls; the previous failure mode (solder ball crack) during temperature cycling on board test were not obvious. The cost is low and the process is simple. It is easy to form the multi-chips package too.

Although preferred embodiments of the present invention have been described, it will be understood by those skilled in the art that the present invention should not be limited to the described preferred embodiments. Rather, various changes and modifications can be made within the spirit and scope of the present invention, as defined by the following Claims.

What is claimed is:

1. A RF module package structure comprising:
    a substrate with a die receiving through hole and contact conductive pads and metal through holes, wherein said substrate is made of organic epoxy, FR5, FR4 BT, silicon, PCB (print circuit board) material, glass or ceramic type material, and the CTE of said substrate is substantially the same with that of a PCB;
    a conductive slice attached on a lower surface of said substrate;
    multiple dice disposed within said die receiving through hole and on said conductive slice, wherein an elastic core paste is filled the space (gap) between a die edge and a sidewall of said through holes of said substrate, and, a top surface of said dice, said substrate and said elastic core paste are at the same plane whereby CTE mismatching between said substrate and said die is reduced during panel form process;
    multiple elastic dielectric stacking structure stacked on said multiple dice and said substrate wherein a bottom of said dielectric stacking structure is directly disposed on a top surface of said substrate and an active surface of said dice whereby the Z direction stress is absorbed;
    multiple re-distribution layers (RDL) formed within said multiple elastic dielectric stacking structure and coupled to said dice;
    a top conductive layer formed over said multiple dielectric stacking structure; and
    multiple heat sinks disposed on said top conductive layer.

2. The structure of claim 1, wherein the materials of said heat sink includes molecular cooling fan.

3. The structure of claim 1, further comprising conductive bumps coupled to pluralities of terminal pads.

4. The structure of claim 1, wherein said multiple dice are including the power amplifier, band pass filter, low noise amplifier, switch and integrated passive device (IPD).

5. The structure of claim 1, wherein the materials of said multiple dice includes the gallium arsenic (GaAs) and silicon chips.

6. The structure of claim 1, wherein said multiple RDLs are including the inductors and resistors.

7. The structure of claim 1, wherein said multiple RDL is made from an alloy comprising Ti/Cu/Au alloy or Ti/Cu/Ni/Au alloy.

8. The structure of claim 1, wherein the material of said top conductive layer includes Cu.

* * * * *